United States Patent
Chou et al.

(10) Patent No.: US 11,959,941 B2
(45) Date of Patent: Apr. 16, 2024

(54) PROBE CARD

(71) Applicant: Industrial Technology Research Institute, Hsinchu (TW)

(72) Inventors: Min-Chieh Chou, Taipei (TW); Meng-Chi Huang, Taoyuan (TW); Tune-Hune Kao, Hsinchu (TW); Yue-Zhen Huang, Yilan County (TW)

(73) Assignee: Industrial Technology Research Institute, Hsinchu (TW)

( * ) Notice: Subject to any disclaimer, the term of this patent is extended or adjusted under 35 U.S.C. 154(b) by 226 days.

(21) Appl. No.: 17/561,997

(22) Filed: Dec. 27, 2021

(65) Prior Publication Data

US 2023/0204628 A1    Jun. 29, 2023

(51) Int. Cl.
| | | |
|---|---|---|
| G01R 1/02 | (2006.01) | |
| G01R 1/04 | (2006.01) | |
| G01R 1/067 | (2006.01) | |
| G01R 1/073 | (2006.01) | |
| G01R 31/28 | (2006.01) | |

(52) U.S. Cl.
CPC ....... *G01R 1/07342* (2013.01); *G01R 1/0735* (2013.01)

(58) Field of Classification Search
CPC . G01R 1/02; G01R 1/04; G01R 1/067; G01R 1/073; G01R 31/02; G01R 31/28
See application file for complete search history.

(56) References Cited

U.S. PATENT DOCUMENTS

| | | |
|---|---|---|
| 4,027,935 A | 6/1977 | Byrnes et al. |
| 6,268,015 B1 | 7/2001 | Mathieu et al. |
| 6,710,608 B2 | 3/2004 | Yoshida et al. |
| 6,917,211 B2 | 7/2005 | Yoshida et al. |
| 11,307,221 B2 * | 4/2022 | Vettori ............... G01R 1/07342 |
| 2007/0200576 A1 | 8/2007 | Laurent et al. |
| 2007/0200578 A1 * | 8/2007 | Kimoto .............. G01R 1/06727 324/754.14 |
| 2009/0263710 A1 | 10/2009 | Kato et al. |
| 2011/0169516 A1 * | 7/2011 | McFarland ........ G01R 1/06722 324/755.05 |

(Continued)

FOREIGN PATENT DOCUMENTS

| | | |
|---|---|---|
| CN | 100422746 | 10/2008 |
| CN | 108572265 | 9/2018 |
| TW | 271006 | 2/1996 |

(Continued)

OTHER PUBLICATIONS

"Office Action of Taiwan Counterpart Application", dated Oct. 5, 2022, p. 1-p. 9.

(Continued)

*Primary Examiner* — Neel D Shah

(74) *Attorney, Agent, or Firm* — JCIPRNET

(57) ABSTRACT

A probe card includes a flexible inorganic material layer, a metal micro structure, and a circuit board. The flexible inorganic material layer has a first surface and a second surface opposite to each other. The metal micro structure is disposed on the first surface. The circuit board is disposed on the second surface, and the circuit board is electrically connected to the metal micro structure. The test signal is adapted to be conducted to the circuit board through the flexible inorganic material layer.

18 Claims, 9 Drawing Sheets

(56) References Cited

U.S. PATENT DOCUMENTS

2020/0348337 A1 11/2020 Vettori
2023/0021227 A1* 1/2023 Crippa ............... G01R 31/2889

FOREIGN PATENT DOCUMENTS

| TW | 586629 | 5/2004 |
|---|---|---|
| TW | I288958 | 10/2007 |
| TW | 200916791 | 4/2009 |
| TW | M425278 | 3/2012 |
| TW | I391670 | 4/2013 |
| TW | 201932845 | 8/2019 |

OTHER PUBLICATIONS

Jinwook Song, et al., "Multi-layer probe card design with signal/power integrity for wafer-level AP test in LPDDR4 channel", 2016 IEEE International Symposium on Electromagnetic Compatibility (EMC), Jul. 25-29, 2016, pp. 547-552.

Jianhui Liu, et al., "The design of multilayer IC test board based on ATE", 2017 18th International Conference on Electronic Packaging Technology (ICEPT), Aug. 16-19, 2017, pp. 1552-1556.

H. Iwai, et al., "Cantilever type probe card for at-speed memory test on wafer", 23rd IEEE VLSI Test Symposium (VTS'05), May 1-5, 2005, pp. 1-5.

Jae-Hwan Lim, et al., "Highly Productive Process Technologies of Cantilever type Microprobe Arrays for Wafer Level Chip Testing", Transactions on Electrical and Electronic Materials, vol. 14, No. 2, Apr. 25, 2013, pp. 63-66.

Mutsuo Daito, et al., "Capacitively Coupled Non-Contact Probing Circuits for Membrane-Based Wafer-Level Simultaneous Testing", IEEE Journal of Solid-State Circuits, vol. 46, No. 10, Oct. 2011, pp. 2386-2395.

* cited by examiner

PROBE CARD

TECHNICAL FIELD

The disclosure relates to a testing device, and in particular, to a probe card.

BACKGROUND

When testing an integrated circuit, a testing apparatus contacts the integrated circuit through a probe card and transmits a test signal to test whether a function of the integrated circuit meets the expectation. The probe card usually includes several probes with an intricate size. When testing the integrated circuit, the test signal from the testing apparatus is transmitted by contacting micro contact points on a device under test (DUT) with the probes, and the integrated circuit is tested with the probe card and a control process of the testing apparatus.

Since tip positions of the probes in the probe card are designed according to the device under test, a structure of the probe card adopted to test a miniaturized integrated circuit is changed accordingly in a current trend of integrated circuit miniaturization of the advanced semiconductor fabrication process. However, in response to a structure of the miniaturized integrated circuit, a width and a pitch of the probes adopted to test the miniaturized integrated circuit are reduced, which leading to a decreased strength of the probes. The probes are subject to permanent deformation under force, thereby greatly affecting a service life and test reliability of the probe card.

SUMMARY

A probe card of the disclosure includes a flexible inorganic material layer, a metal micro structure, and a circuit board. The flexible inorganic material layer has a first surface and a second surface opposite to each other. The metal micro structure is disposed on the first surface. The circuit board is disposed on the second surface, and the circuit board is electrically connected to the metal micro structure. A test signal is adapted to be conducted to the circuit board through the metal micro structure. The yield strength of the flexible inorganic material layer is greater than 500 MPa, or the Young's modulus of the flexible inorganic material layer is greater than 50 GPa.

The probe card of the disclosure includes the flexible inorganic material layer, the metal micro structure, the circuit board, and at least two guide plates. The flexible inorganic material layer has multiple surfaces. The metal micro structure is disposed on at least one of the surfaces and has a connection end. The circuit board is connected to the connection end. The test signal is adapted to be conducted to the circuit board through the metal micro structure. Each of the guide plates has multiple through-holes, and the flexible inorganic material layer and the metal micro structure penetrate the through-holes of each of the guide plates. The yield strength of the flexible inorganic material layer is greater than 500 MPa, or the Young's modulus of the flexible inorganic material layer is greater than 50 GPa.

In order to make the aforementioned features and advantages of the disclosure comprehensible, embodiments accompanied with drawings are described in detail below.

DETAILED DESCRIPTION OF DISCLOSED EMBODIMENTS

The disclosure provides a probe card, and a probe of the probe card exhibits a favorable strength through a flexible inorganic material layer.

The disclosure provides a probe card, and a probe of the probe card exhibits a favorable strength through a flexible inorganic material layer.

Figure 1:
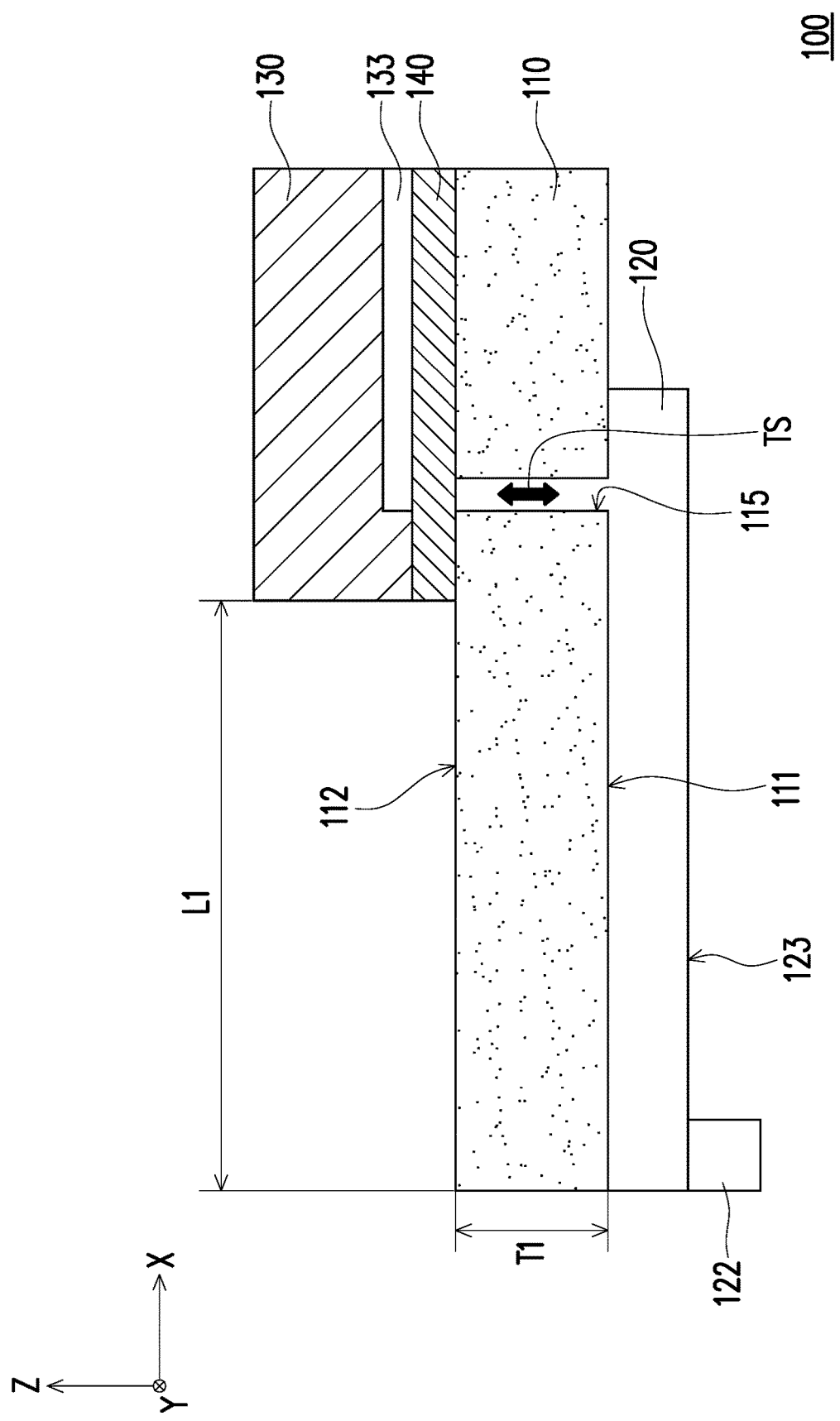
FIG. 1 is a side schematic diagram of a probe card according to an embodiment of the disclosure.
Figure 2:
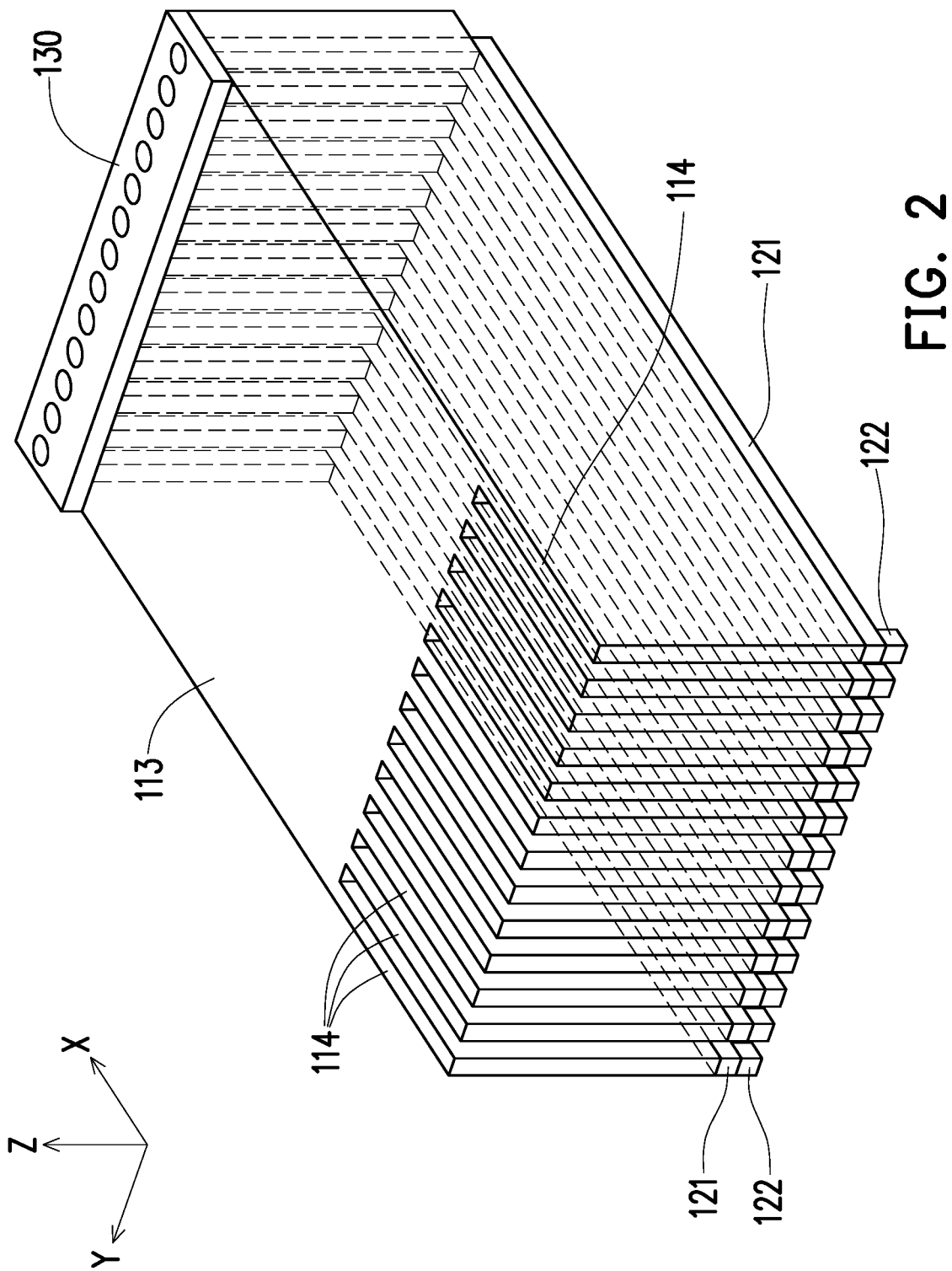
FIG. 2 is a schematic perspective diagram of the probe card of FIG. 1.

FIG. 1 is a side schematic diagram of a probe card according to an embodiment of the disclosure. FIG. 2 is a schematic perspective diagram of a flexible inorganic material layer, a metal micro structure, and a bonding layer of the probe card of FIG. 1. Here, note that in the drawings, the proportional relationships, such as the size or the thickness, between a flexible inorganic material layer 110, a metal micro structure 120, a circuit board 130, and a bonding layer 140 of a probe card 100 are only schematic and do not represent their actual and specific structure scale and proportional relationships. In addition, the Cartesian coordinate system X-Y-Z is provided for description of elements below.

Referring to FIG. 1 first, the probe card 100 includes the flexible inorganic material layer 110, the metal micro structure 120, and the circuit board 130. A probe of the probe card 100 of the embodiment is adapted to transmit a test signal TS. Here, the probe of the probe card 100 is formed by the flexible inorganic material layer 110 and the metal micro structure 120. In the embodiment, a material of the flexible inorganic material layer 110 may be, for example, glass, ceramic, or a silicon wafer; however, the disclosure is not limited thereto. In the embodiment, a material of the metal micro structure 120 is a highly conductive material. The material of the metal micro structure 120 is, for example, copper, nickel, an alloy of nickel, cobalt, and phosphorus, an alloy of nickel and cobalt, an alloy of nickel and manganese, or an alloy of rhodium and ruthenium; however, the disclosure is not limited thereto. In the embodiment, the circuit board 130 includes a printed circuit board or a ceramic circuit board; however, the disclosure is not limited thereto.

Specifically, referring to FIG. 1, in the embodiment, the flexible inorganic material layer 110 has a first surface 111 and a second surface 112 opposite to each other. The metal micro structure 120 is disposed on the first surface 111, and the circuit board 130 is disposed on the second surface 112. The circuit board 130 is electrically connected to the metal micro structure 120. Since the material of the metal micro structure 120 is the highly conductive material, the test signal TS is adapted to be conducted to the circuit board 130 through the metal micro structure 120.

For example, in the embodiment, the metal micro structure 120 is adapted to contact a device under test (not shown) to test the device under test (not shown). The device under test (not shown) is, for example, an integrated circuit or a die on a semiconductor wafer; however, the disclosure is not limited thereto. The circuit board 130 is, for example, electrically connected to a testing apparatus (not shown) generating the test signal TS; however, the disclosure is not limited thereto. That is, in the embodiment, for example, with the test signal TS provided by the testing apparatus (not shown), the device under test (not shown) is tested by the probe card 100; however, the disclosure is not limited thereto.

It is worth noting that in the embodiment, since the metal micro structure 120 is disposed on the flexible inorganic material layer 110, the metal micro structure 120 may be supported by the flexible inorganic material layer 110, and thus the probe of the probe card 100 exhibits a favorable strength and flexibility and not be likely to deform. Accordingly, when a probe pitch and width are reduced, compared with a probe in the conventional technology that is only manufactured with metal and tends to fail due to permanent deformation under force, the probe of the probe card 100 of the embodiment is provided with the flexible inorganic material layer 110, thereby still exhibiting the favorable strength and flexibility.

Generally, a yield strength of a metal material adopted to manufacture a cantilever of a probe is less (approximately 70 MPa to 300 MPa). Hence, after a micro cantilever-type probe is manufactured, the cantilever is likely to be bent under force, which leads to permanent deformation. In the embodiment, a yield strength of the flexible inorganic material layer 110 is adequate to support the metal micro structure 120. In an embodiment, the yield strength of the flexible inorganic material layer 110 is, for example, greater than 500 MPa, and a Young's modulus of flexible inorganic material layer 110 is, for example, greater than 50 GPa; however, the disclosure is not limited thereto. In an embodiment, the yield strength of the flexible inorganic material layer 110 is, for example, 500 MPa to 1200 MPa, and the Young's modulus of the flexible inorganic material layer 110 is, for example, 50 GPa to 400 GPa. In addition, in a structure design, a thickness T1 of the flexible inorganic material layer 110, for example, ranges from 30 µm to 300 µm. In an embodiment, a ratio (i.e. L1/T1) of a length L1 of the flexible inorganic material layer 110 to the thickness T1, for example, ranges from 9 to 30; however, the disclosure is not limited thereto.

The probe card 100 of the embodiment is further described below.

Referring to FIG. 2, in the embodiment, the flexible inorganic material layer 110 includes a body portion 113 and multiple interdigitated portions 114. The metal micro structure 120 includes multiple metal sub-structures 121 corresponding to and connected to the multiple interdigitated portions 114. The multiple interdigitated portions 114 are connected to one side of the body portion 113, and each of the metal sub-structures 121 is adapted to extend with the corresponding interdigitated portion 114 toward the body portion 113 along a direction parallel to the X-axis.

Specifically, referring to FIG. 1 and FIG. 2, in the embodiment, the body portion 113 of the flexible inorganic material layer 110 has a via 115 penetrating between the first surface 111 and the second surface 112 and connected to each of the metal sub-structures 121 and the circuit board 130. Each of the metal sub-structures 121 is disposed on the first surface 111 and the via 115. That is, after each of the metal sub-structures 121 extends toward the body portion 113 along the corresponding interdigitated portion 114 (along the direction parallel to the X-axis), each of the metal sub-structures 121 is adapted to extend toward the circuit board 130 along the via 115 (along a direction parallel to the Y-axis). Accordingly, the circuit board 130 may be electrically connected to the metal sub-structures 121 through the via 115.

Specifically, referring to FIG. 1 and FIG. 2, in the embodiment, the metal micro structure 120 includes multiple protruding portions 122, and each of the protruding portions 122 is disposed at the corresponding metal sub-structure 121 and located on a third surface 123 opposite to the first surface 111. Specifically, the protruding portions 122 are disposed at an end of the metal sub-structures 121 corresponding to the interdigitated portions 114 of the flexible inorganic material layer 110 and protrude out of the third surface 123. Accordingly, the test signal TS is adapted to be conducted to the circuit board 130 through the metal sub-structures 121 along the via 115, and each of the protruding portions 122 may be adapted to contact a contact point (not shown) of the device under test. In an embodiment, a material of each of the protruding portions 122 includes an alloy of nickel and phosphorus, an alloy of nickel and cobalt, an alloy of nickel and manganese, or an alloy of rhodium and ruthenium; however, the disclosure is not limited thereto.

Here, note that in a method for manufacturing the probe card of the embodiment, for example, an inorganic material layer is manufactured as the flexible inorganic material layer 110 with a laser modification and etching process, and the metal micro structure (including the protruding portions) is manufactured on the inorganic material layer as a two-phase metal structure with a photolithography process and an electroplating process to form the probe card with a conducting wire. However, the disclosure is not intended to limit the manufacturing method and the order for manufacturing the probe card 100.

In addition, referring to FIG. 1, in the embodiment, the probe card 100 further includes the bonding layer 140 located between the flexible inorganic material layer 110 and the circuit board 130. A material of the bonding layer 140 is, for example, Ajinomoto Build-up Film (ABF), tin, a tin alloy, or silver paste. In this way, the flexible inorganic material layer 110 may be bonded to the circuit board 130 through the bonding layer 140. In an embodiment, the circuit board 130 further includes a pad 133. The metal micro structure 120 may be electrically connected to the pad 133 of the circuit board 130 through the bonding layer 140.

Here, note that the reference numerals of the elements and a part of the description in the embodiments above are used in the embodiments below in which the same or similar elements are denoted with the same reference numerals. The description of the same technological features will be omitted. With regard to the omitted description, the embodiments above may be referred to, and it will not be repeated in the embodiments below.

Figure 3:
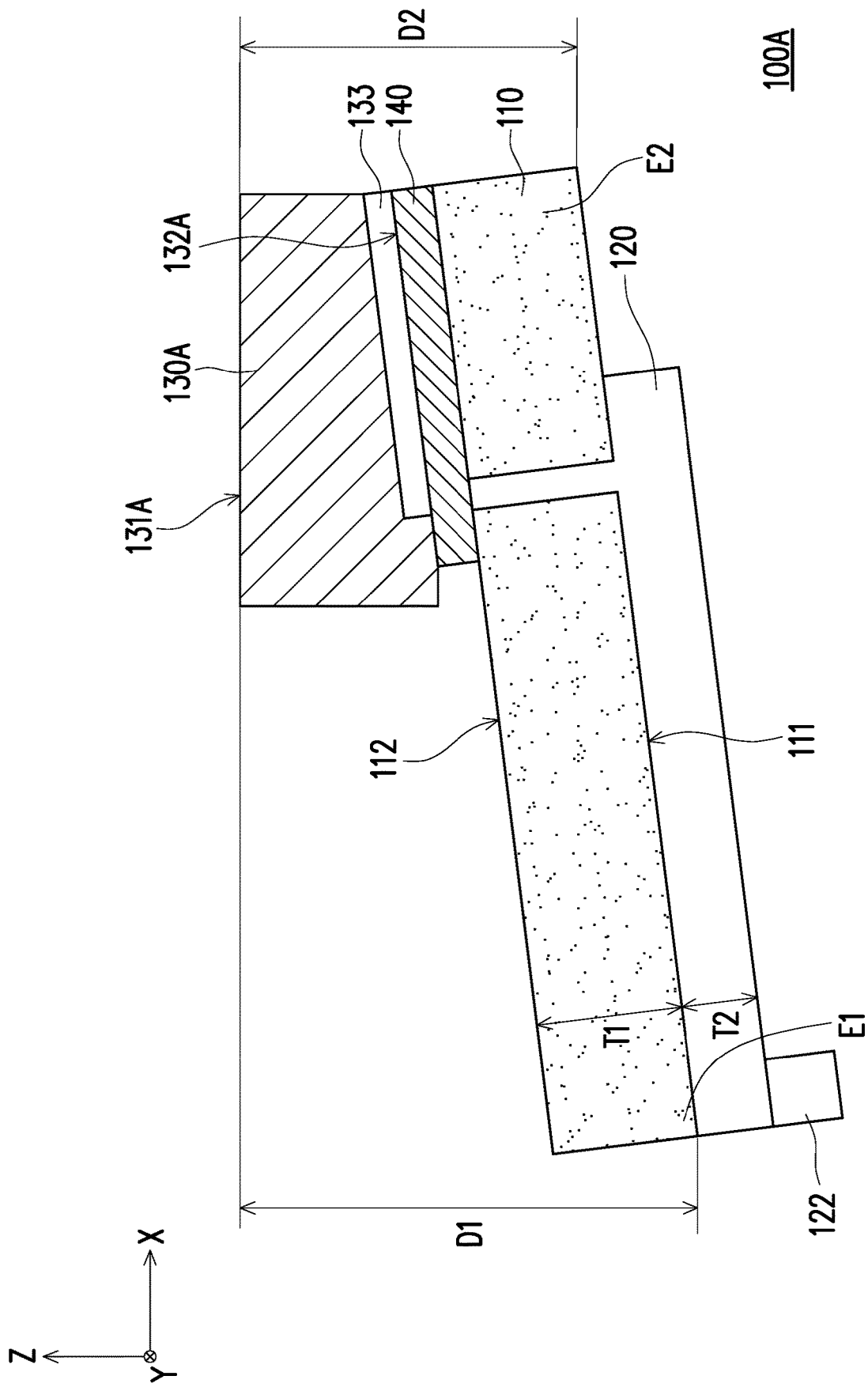
FIG. 3 is a side schematic diagram of a probe card according to another embodiment of the disclosure.

FIG. 3 is a side schematic diagram of a probe card according to another embodiment of the disclosure. Referring to FIG. 1 and FIG. 3 together, a probe card 100A of the embodiment is similar to the probe card 100 of FIG. 1, but note that a structure of a circuit board 130A of FIG. 3 includes an inclined surface.

Referring to FIG. 3, in the embodiment, the circuit board 130A has a horizontal face 131A and an inclined face 132A opposite to each other. The second surface 112 of the flexible inorganic material layer 110 may be bonded to the inclined face 132A of the circuit board 130A through the bonding layer 140. Here, an inclination of the inclined face 132A relative to the horizontal face 131A is, for example, 1.5 degrees to 6 degrees; however, the disclosure is not limited thereto.

Specifically, in the embodiment, the flexible inorganic material layer 110 has a first end E1 and a second end E2 opposite to each other and connected to the second surface 112. The protruding portions 122 of the metal micro structure 120 may be disposed at the first end E1 corresponding to the flexible inorganic material layer 110. Here, note that, in the embodiment, a difference between a vertical distance D1 from the first end E1 to the horizontal face 131A and a vertical distance D2 from the second end E2 to the horizontal face 131A ranges from 50 μm to 500 μm; however, the disclosure is not limited thereto.

That is, in a case where a thickness T2 of the metal micro structure 120 is far less than the thickness T1 of the flexible inorganic material layer 110, an inclined structure of the circuit board 130A above may cause the flexible inorganic material layer 110 to be inclined (i.e. the first end E1 is closer to the device under test than the second end E2). Hence, when the protruding portions 122 of the metal micro structure 120 contact the device under test (not shown), the flexible inorganic material layer 110 may not structurally interfere with the device under test (not shown).

Figure 4:
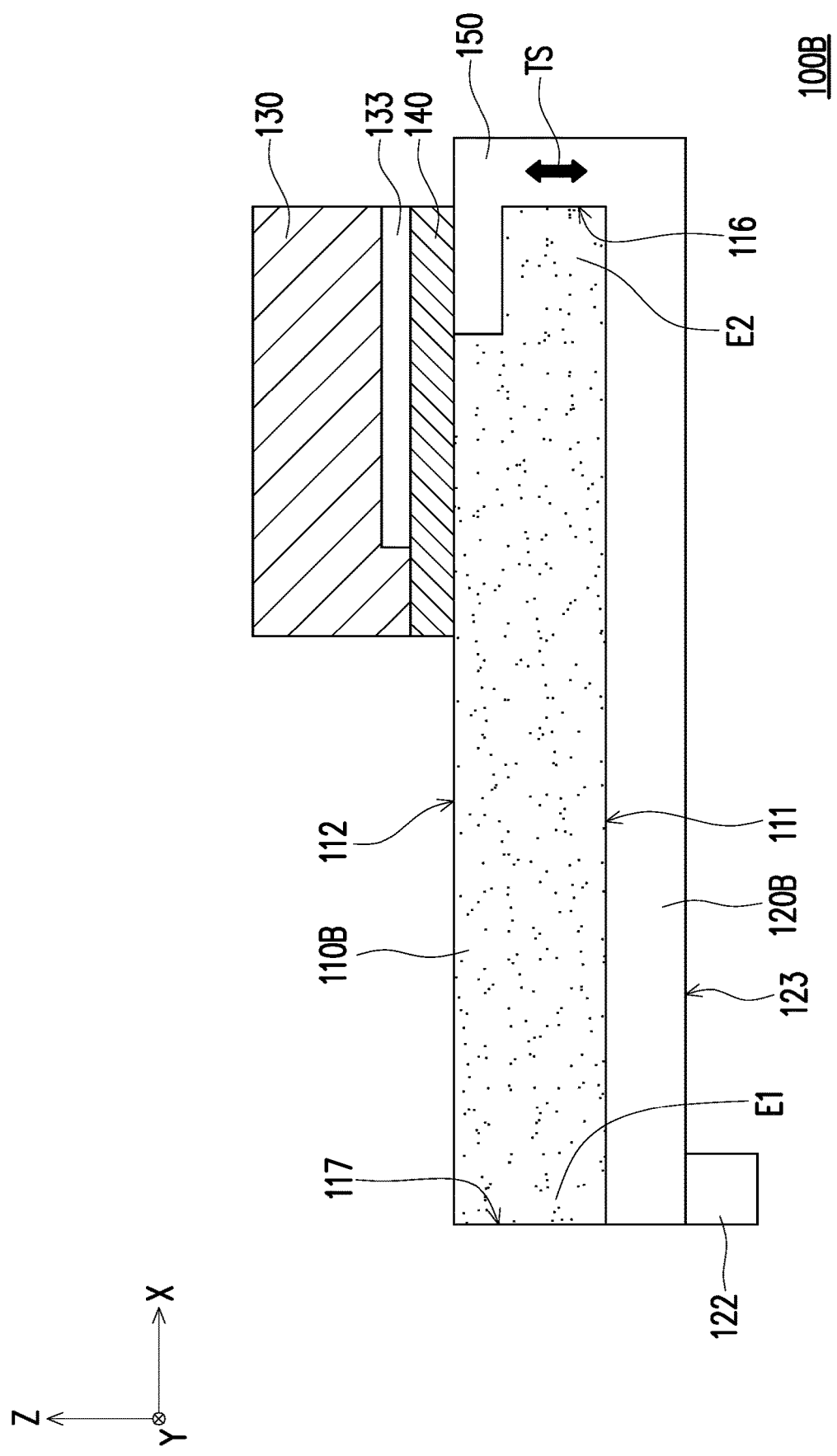
FIG. 4 is a side schematic diagram of a probe card according to another embodiment of the disclosure.

FIG. 4 is a side schematic diagram of a probe card according to another embodiment of the disclosure. Referring to FIG. 1 and FIG. 4 together, a probe card 100B of the embodiment is similar to the probe card 100 of FIG. 1, but note that the probe card 100B of FIG. 4 further includes a first conducting wire layer 150, and a flexible inorganic material layer 110B does not include the via 115. A metal micro structure 120B completely covers the first surface 111 of the flexible inorganic material layer 110B.

Referring to FIG. 4, in the embodiment, the flexible inorganic material layer 110B has a first side wall 116 and a second side wall 117 connected between the first surface 111 and the second surface 112 and the first end E1 and the second end E2 opposite to each other and connected to the second surface 112. The first side wall 116 is located at the second end E2 and close to the circuit board 130, and the second side wall 117 is located at the first end E1 and away from the circuit board 130. The protruding portions 122 of the metal micro structure 120B may be disposed at the first end E1 corresponding to the flexible inorganic material layer 110B.

In the embodiment, the probe card 100B further includes the first conducting wire layer 150. The first conducting wire layer 150 is disposed on the second surface 112 of the flexible inorganic material layer 110B and the first side wall 116 of the flexible inorganic material layer 110B close to the circuit board 130, and the first conducting wire layer 150 is connected to the metal micro structure 120B and the circuit board 130. Specifically, after the metal micro structure 120B extends from the first end E1 toward the second end E2 along the first surface 111 of the flexible inorganic material layer 1101B (the direction parallel to the X-axis), the metal micro structure 120B is adapted to be connected to the first conducting wire layer 150. The first conducting wire layer 150 is adapted to extend toward the circuit board 130 along the first side wall 116 (the direction parallel to the Y-axis) and lastly further extend along the second surface 112 of the flexible inorganic material layer 110B (the direction parallel to the X-axis). Accordingly, the circuit board 130 may be electrically connected to the metal micro structure 120B through the first conducting wire layer 150.

Accordingly, the test signal TS is adapted to be conducted to the circuit board 130 from the metal micro structure 120B through the first conducting wire layer 150 to test the device under test (not shown).

Figure 5:
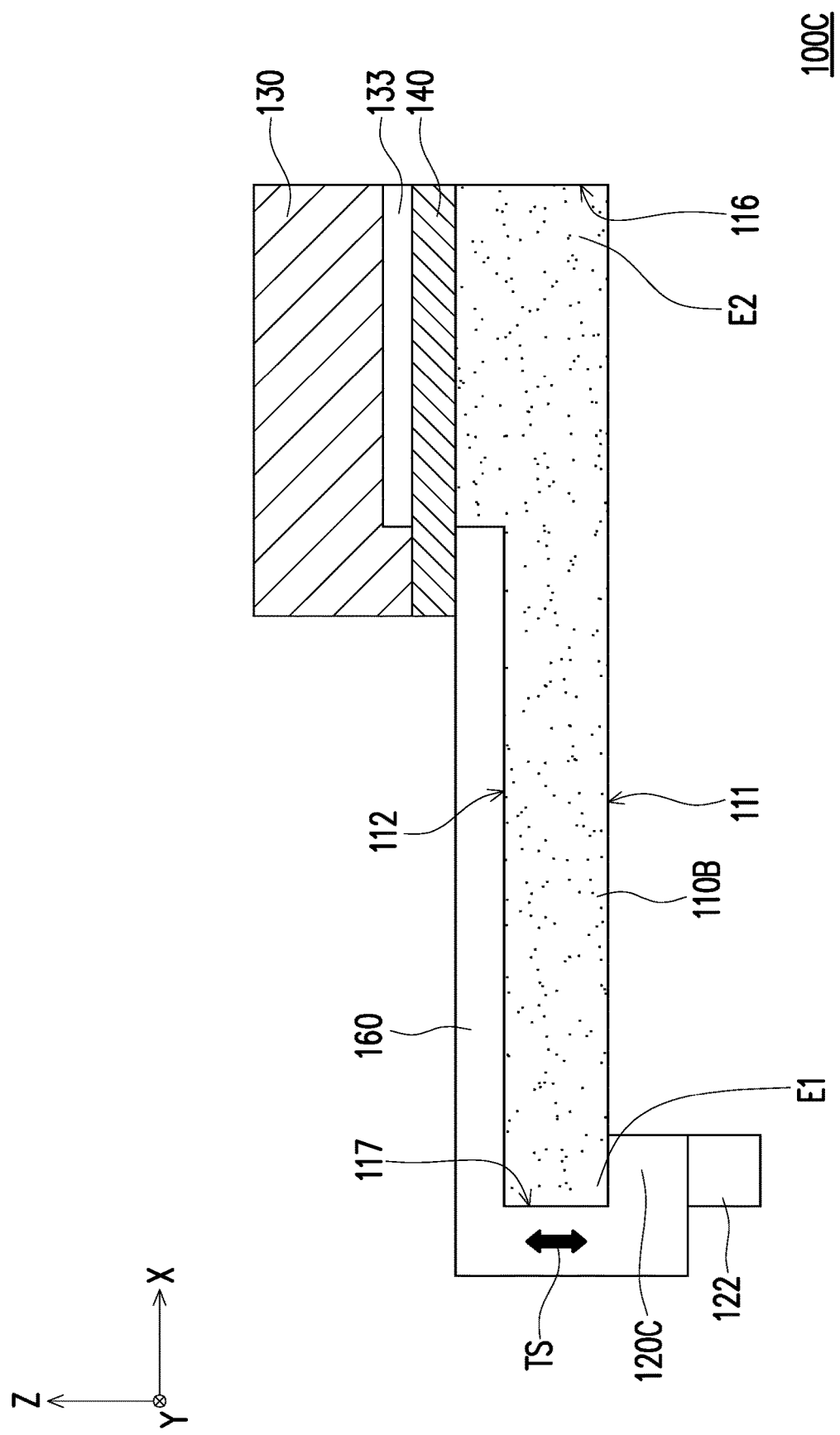
FIG. 5 is a side schematic diagram of a probe card according to another embodiment of the disclosure.

FIG. 5 is a side schematic diagram of a probe card according to another embodiment of the disclosure. Referring to FIG. 4 and FIG. 5 together, a probe card 100C of the embodiment is similar to the probe card 100B of FIG. 4, but note that the first conducting wire layer 150 is replaced with a second conducting wire layer 160 in the probe card 100C of FIG. 5.

Referring to FIG. 5, in the embodiment, the flexible inorganic material layer 110B has the first side wall 116 and the second side wall 117 connected between the first surface 111 and the second surface 112 and the first end E1 and the second end E2 opposite to each other and connected to the second surface 112. The first side wall 116 is located at the second end E2 and close to the circuit board 130, and the second side wall 117 is located at the first end E1 and away from the circuit board 130. The protruding portions 122 of the metal micro structure 120C may be disposed at the first end E1 corresponding to the flexible inorganic material layer 110B.

In the embodiment, the probe card 100B further includes the second conducting wire layer 160. The second conducting wire layer 160 is disposed on the second surface 112 of the flexible inorganic material layer 110B and the second side wall 117 of the flexible inorganic material layer 110B away from the circuit board 130, and the second conducting wire layer 160 is connected to the metal micro structure 120C and the circuit board 130. Specifically, after the metal micro structure 120C extends from the first end E1 toward the second side wall 117 along the first surface 111 of the flexible inorganic material layer 110B (the direction parallel to the X-axis), the metal micro structure 120C is adapted to be connected to the second conducting wire layer 160. The second conducting wire layer 160 is adapted to extend along the second side wall 117 (the direction parallel to the Y-axis) and lastly further extend toward the circuit board 130 along the second surface 112 of the flexible inorganic material layer 1101B (the direction parallel to the X-axis). Accordingly, the circuit board 130 may be electrically connected to the metal micro structure 120C through the second conducting wire layer 160.

Accordingly, the test signal TS is adapted to be conducted to the circuit board 130 from the metal micro structure 120C through the second conducting wire layer 160 to test the device under test (not shown).

Figure 6:
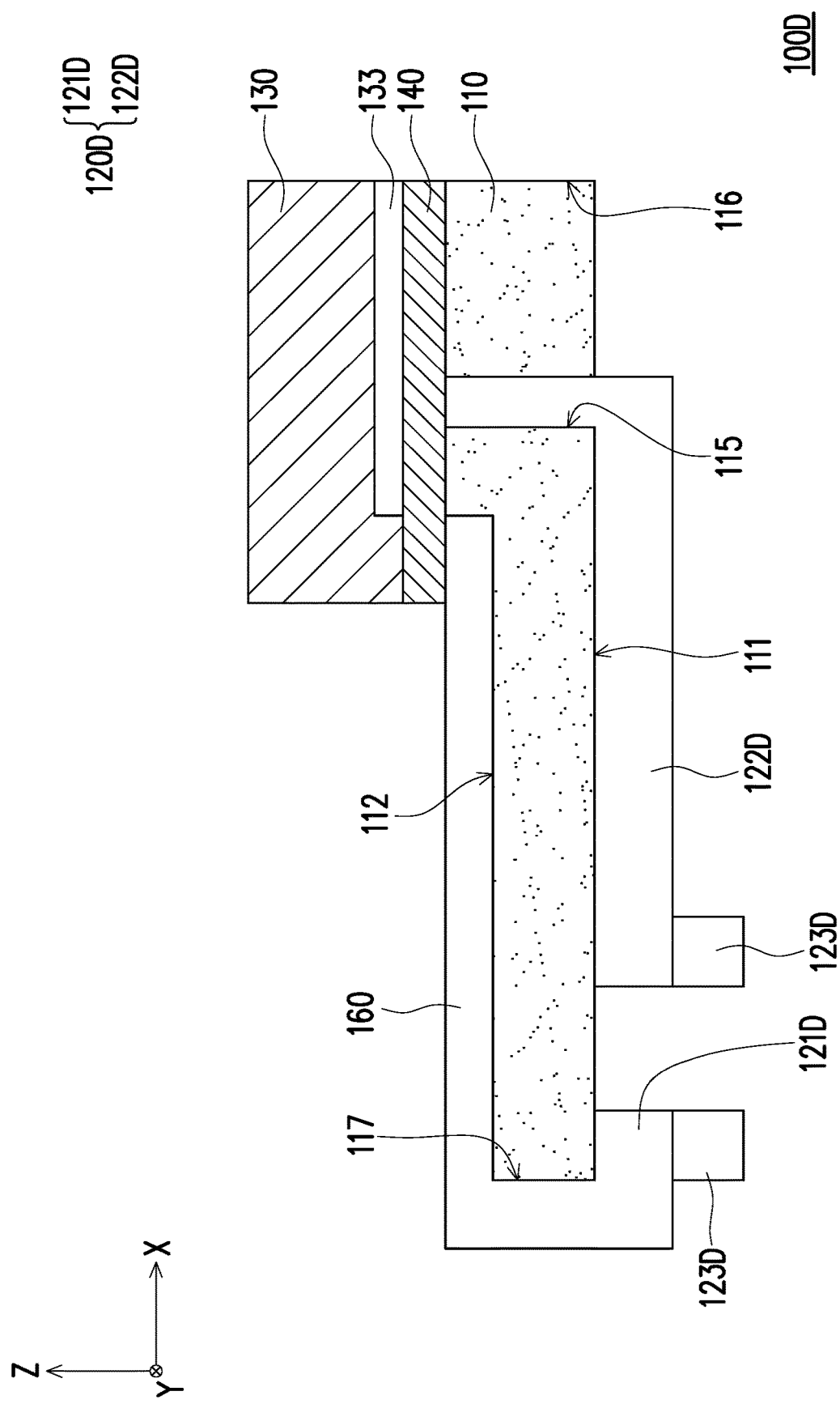
FIG. 6 is a side schematic diagram of a probe card according to another embodiment of the disclosure.

FIG. 6 is a side schematic diagram of a probe card according to another embodiment of the disclosure. Referring to FIG. 1 and FIG. 6 together, a probe card 100D of the embodiment is similar to the probe card 100 of FIG. 1. The difference between the probe card 100D and the probe card 100 lies in a structure of a metal micro structure 120D. The structure of the metal micro structure 120D further includes the second conducting wire layer 160.

Referring to FIG. 6, in the embodiment, the flexible inorganic material layer 110 has the via 115 penetrating between the first surface 111 and the second surface 112 and the first side wall 116 and the second side wall 117 connected between the first surface 111 and the second surface 112.

In the embodiment, the metal micro structure 120D includes a first micro structure 121D and a second micro structure 122D. The first micro structure 121D and the second micro structure 122D are disposed on the first surface 111 of the flexible inorganic material layer 110. The second conducting wire layer 160 is disposed on the second surface 112 of the flexible inorganic material layer 110 and the second side wall 117 of the flexible inorganic material layer 110 away from the circuit board 130, and the second conducting wire layer 160 is connected to the first micro structure 121D and the circuit board 130. The via 115 is connected to the second micro structure 122D and the circuit board 130. The first micro structure 121D and the second micro structure 122D respectively have a protruding portion 123D at one side of the first surface 111.

Specifically, in the embodiment, after the first micro structure 121D extends toward the second side wall 117 along the first surface 111 of the flexible inorganic material layer 110 (the direction parallel to the X-axis), the first micro structure 121D is adapted to be connected to the second conducting wire layer 160. The second conducting wire layer 160 is adapted to extend along the second side wall 117 (the direction parallel to the Y-axis) and lastly further extend toward the circuit board 130 along the second surface 112 of the flexible inorganic material layer 110B (the direction parallel to the X-axis). After the second micro structure 122D extends toward the via 115 along the first surface 111 of the flexible inorganic material layer 110 (the direction parallel to the X-axis), the second micro structure 122D is adapted to extend toward the circuit board 130 along the via 115 (the direction parallel to the Y-axis). Accordingly, the circuit board 130 may be respectively electrically connected to the first micro structure 121D and the second micro structure 122D of the metal micro structure 120D through the second conducting wire layer 160 and the via 115.

Accordingly, the test signal TS is adapted to be conducted to the circuit board 130 from the metal micro structure 120D respectively through the via 115 and the second conducting wire layer 160, and the device under test (not shown) is contacted through the protruding portions 123D of the first micro structure 121D and the second micro structure 122D at the same time so as to test the device under test (not shown) with denser contact points.

Figure 7:
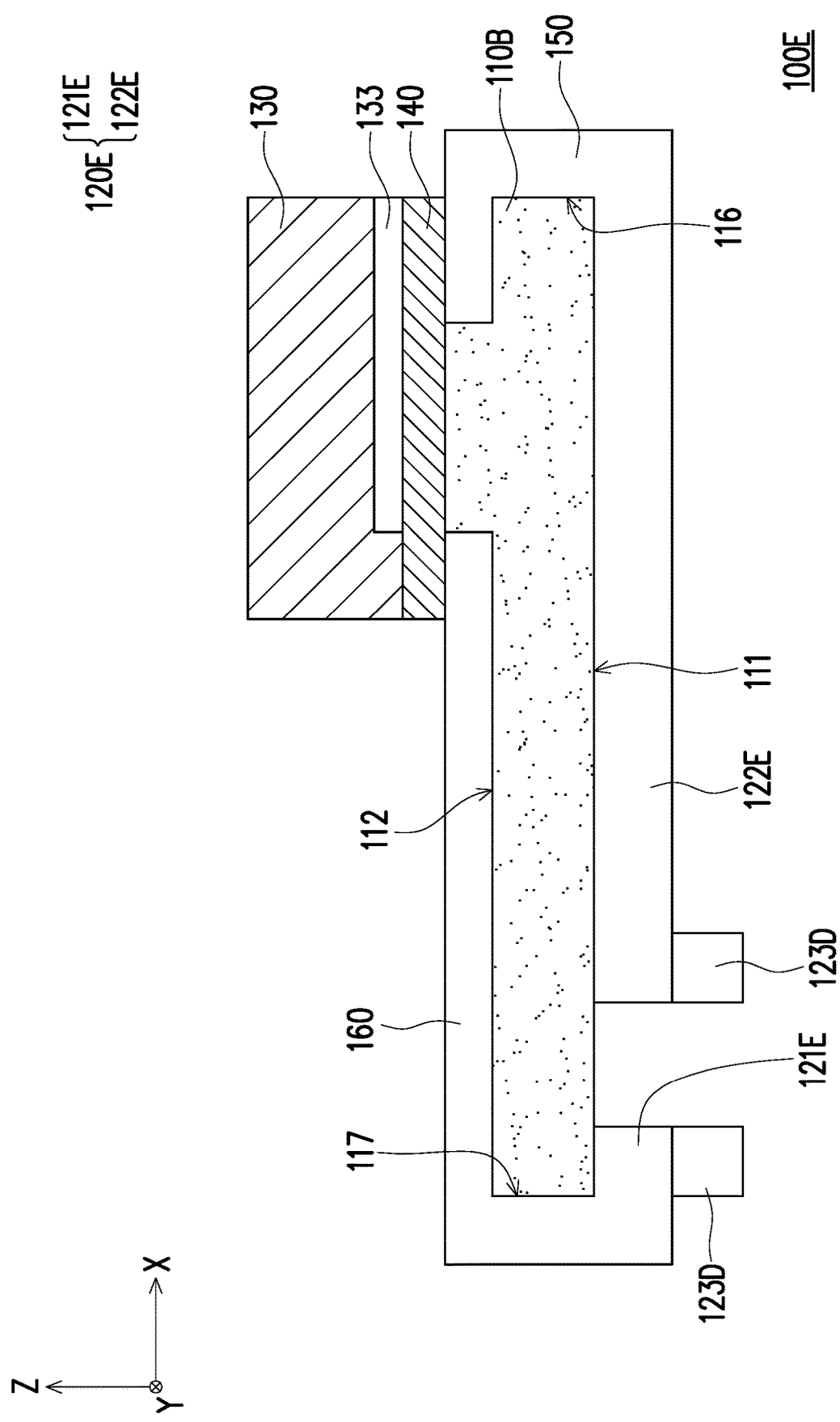
FIG. 7 is a side schematic diagram of a probe card according to another embodiment of the disclosure.

FIG. 7 is a side schematic diagram of a probe card according to another embodiment of the disclosure. Referring to FIG. 6 and FIG. 7 together, a probe card 100E of the embodiment is similar to the probe card 100D of FIG. 6, but note that the probe card 100E of FIG. 7 further includes the first conducting wire layer 150, and the flexible inorganic material layer 110B does not include the via 115.

Referring to FIG. 7, in the embodiment, the flexible inorganic material layer 110B has the first surface 111 and the second surface 112 opposite to each other and the first side wall 116 and the second side wall 117 connected between the first surface 111 and the second surface 112.

In the embodiment, the probe card 100E further includes the first conducting wire layer 150, and a metal micro structure 120E includes a first micro structure 121E and a second micro structure 122E. The first micro structure 121E and the second micro structure 122E are disposed on the first surface 111 of the flexible inorganic material layer 110B. The first conducting wire layer 150 is disposed on the second surface 112 of the flexible inorganic material layer 110B and the first side wall 116 of the flexible inorganic material layer 110B close to the circuit board 130, and the first conducting wire layer 150 is connected to the second micro structure 122E and the circuit board 130. The second conducting wire layer 160 is disposed on the second surface 112 of the flexible inorganic material layer 110B and the second side wall 117 of the flexible inorganic material layer 110B away from the circuit board 130, and the second conducting wire layer 160 is connected to the first micro structure 121E and the circuit board 130. The first micro structure 121E and the second micro structure 122E respectively have the protruding portion 123D at one side of the first surface 111.

Specifically, in the embodiment, after the first micro structure 121E extends toward the second side wall 117 along the first surface 111 of the flexible inorganic material layer 110B (the direction parallel to the X-axis), the first micro structure 121E is adapted to be connected to the second conducting wire layer 160. The second conducting wire layer 160 is adapted to extend along the second side wall 117 (the direction parallel to the Y-axis) and lastly further extend toward the circuit board 130 along the second surface 112 of the flexible inorganic material layer 110B (the direction parallel to the X-axis). After the second micro structure 122E extends toward the first side wall 116 along the first surface 111 of the flexible inorganic material layer 110B (the direction parallel to the X-axis), the second micro structure 122E is adapted to be connected to the first conducting wire layer 150. The first conducting wire layer 150 is adapted to extend toward the circuit board 130 along the first side wall 116 (the direction parallel to the Y-axis) and lastly further extend along the second surface 112 of the flexible inorganic material layer 110B (the direction parallel to the X-axis). Accordingly, the circuit board 130 may be respectively electrically connected to the first micro structure 121E and the second micro structure 122E of the metal micro structure 120E through the second conducting wire layer 160 and the first conducting wire layer 150.

Accordingly, the test signal TS is adapted to be conducted to the circuit board 130 from the metal micro structure 120E through the first conducting wire layer 150 and the second conducting wire layer 160, and the device under test (not shown) is contacted through the protruding portions 123D of the first micro structure 121E and the second micro structure 122E at the same time so as to test the device under test (not shown) with the denser contact points.

Figure 8B:
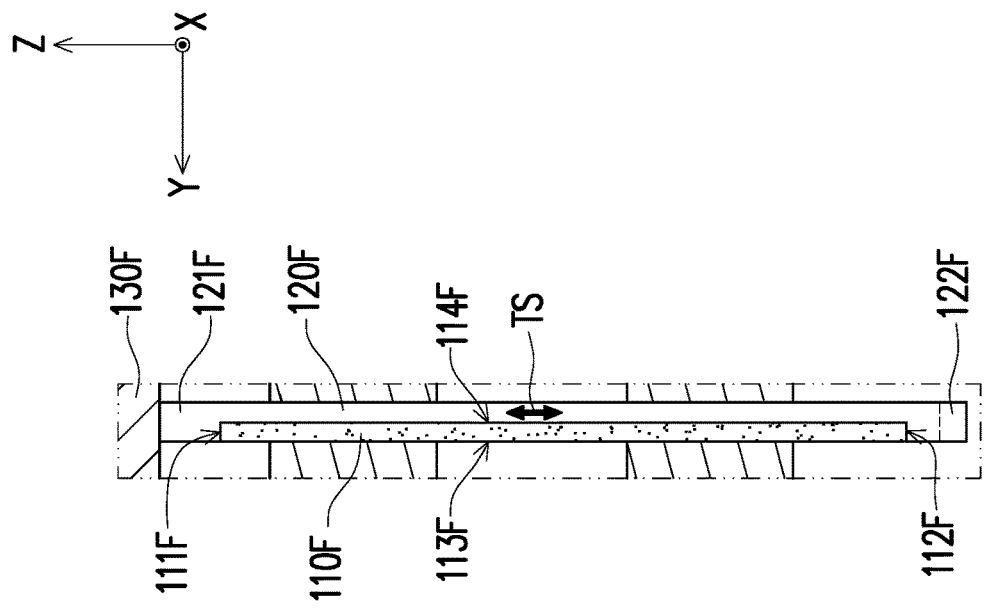
FIG. 8B is a schematic partial enlarged diagram of the probe card of FIG. 8A.
Figure 8A:
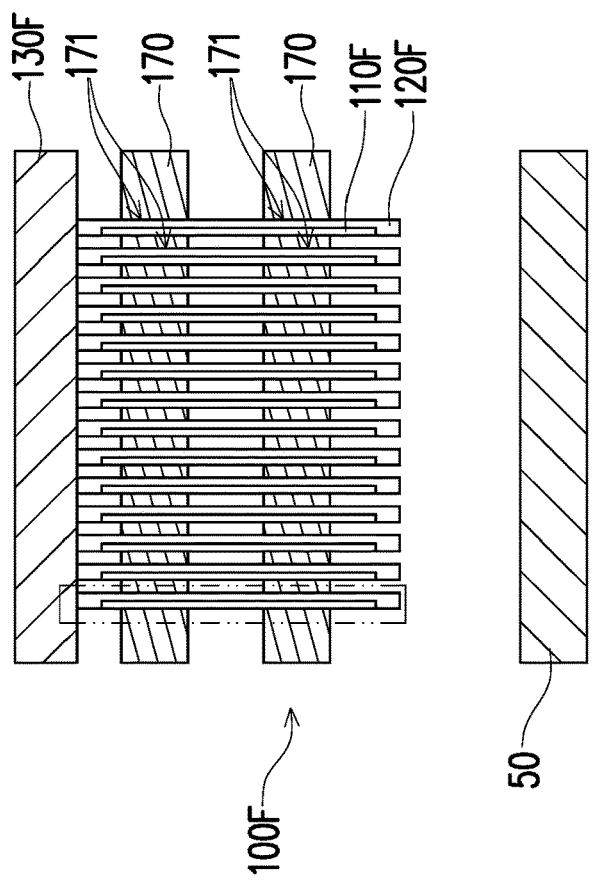
FIG. 8A is a side schematic cross-sectional diagram of a probe card according to another embodiment of the disclosure.

FIG. 8A is a side schematic cross-sectional diagram of a probe card according to another embodiment of the disclosure. FIG. 8B is a schematic partial enlarged diagram of the probe card of FIG. 8A. Referring to FIG. 1 and FIG. 8A together, a probe card 100F of the embodiment is similar to the probe card 100 of FIG. 1, but note that the probe card 100F is a vertical probe card, and the probe card 100 of FIG. 1 is a cantilever-type probe card.

Referring to FIG. 8A and FIG. 8B, in the embodiment, the probe card 100F includes a flexible inorganic material layer 110F, a metal micro structure 120F, and a circuit board 130F. Here, a probe of the probe card 100F is formed by the flexible inorganic material layer 110F and the metal micro structure 120F and is adapted to transmit the test signal TS.

Specifically, referring to FIG. 8B, in the embodiment, the flexible inorganic material layer 110F has multiple surfaces, and the surfaces include an upper surface 111F and a lower surface 112F opposite to each other and a first side surface 113F and a second side surface 114F connected to the upper surface 111F and the lower surface 112F. The metal micro structure 120F is disposed on and covers the upper surface 111F, the lower surface 112F, and the second side surface 114F, and the metal micro structure 120F has a connection end 121F. The circuit board 130F is connected to the connection end 121F along a direction parallel to the Z-axis, and the test signal TS is adapted to be conducted to the circuit board 130F through the metal micro structure 120F.

Specifically, referring to FIG. 8A and FIG. 8B, in the embodiment, the probe card 100F further includes two guide plates 170, and the metal micro structure 120F includes a protruding portion 122F. Each of the guide plates 170 has multiple through-holes 171 corresponding to the probe (i.e. the flexible inorganic material layer 110F and the metal micro structure 120F), and the probe (i.e. the flexible inorganic material layer 110F and the metal micro structure 120F) penetrates the through-holes 171 of each of the guide plates 170. The protruding portion 122F of the metal micro structure 120F is located at an end opposite to the connection end 121F to contact a device 50 under test.

Here, note that in the embodiment, the two guide plates 170 are disposed in a misaligned manner (not shown). Since the through-holes 171 of the two guide plates 170 may allow the flexible inorganic material layer 110F and the metal micro structure 120F to penetrate, with the misalignment of the multiple guide plates 170, the probe may be effectively fixed and a contact direction of the probe may be adjusted.

In addition, in the embodiment, a material of the flexible inorganic material layer 11 OF includes glass, ceramic, or a silicon wafer; however, the disclosure is not limited thereto. In the embodiment, a material of the metal micro structure 120F includes copper, nickel, an alloy of nickel, cobalt, and phosphorus, an alloy of nickel and cobalt, an alloy of nickel and manganese, or an alloy of rhodium and ruthenium; however, the disclosure is not limited thereto. In the embodiment, the circuit board 130F includes a printed circuit board or a ceramic circuit board; however, the disclosure is not limited thereto. In the embodiment, a material of each of the guide plates 170 is not conductive, including plastic or ceramic; however, the disclosure is not limited thereto. In the embodiment, a material of the protruding portion 122F of the metal micro structure 120F includes an alloy of nickel, cobalt, and phosphorus, an alloy of nickel and cobalt, an alloy of nickel and manganese, or an alloy of rhodium and ruthenium; however, the disclosure is not limited thereto. In other embodiments, the metal micro structure 120F may not include the protruding portion 122F. When the metal micro structure 120F does not include the protruding portion 122F, the material of the metal micro structure 120F includes an alloy of nickel and cobalt, an alloy of nickel and manganese, or an alloy of rhodium and ruthenium; however, the disclosure is not limited thereto.

For example, in the embodiment, the metal micro structure 120F is adapted to contact the device 50 under test to test the device 50 to under test. The device 50 under test is, for example, an integrated circuit or a die on a semiconductor wafer; however, the disclosure is not limited thereto. The circuit board 130F is, for example, connected to the testing apparatus (not shown) generating the test signal TS; however, the disclosure is not limited thereto. That is, in the embodiment, for example, with the test signal TS provided by the testing apparatus (not shown), the device 50 under test is tested by the probe card 100F; however, the disclosure is not limited thereto.

It is worth noting that in the embodiment, since the metal micro structure 120F is disposed on and covers the upper surface 111F, the lower surface 112F, and the second side surface 114F of the flexible inorganic material layer 110F, the metal micro structure 120F may be supported by the flexible inorganic material layer 110F, and thus the probe of the probe card 100F exhibits a favorable strength and flexibility and not be likely to deform. Accordingly, when a probe pitch and width are reduced, compared with a probe in the conventional technology that is manufactured with metal and tends to fail due to permanent deformation under force, the probe of the probe card 100F of the embodiment is provided with the flexible inorganic material layer 110F, thereby still exhibiting the favorable strength and flexibility.

Generally, a yield strength of a metal material adopted to manufacture a probe is less (approximately 70 MPa to 300 MPa). Hence, after a micro vertical probe is manufactured, the probe is likely to be bent under force, which leads to permanent deformation. In the embodiment, a yield strength of the flexible inorganic material layer 110F is adequate to support the metal micro structure 120F. In an embodiment, the yield strength of the flexible inorganic material layer 110F is, for example, greater than 500 MPa, and a Young's modulus of flexible inorganic material layer 110F is, for example, greater than 50 GPa; however, the disclosure is not limited thereto. In an embodiment, the yield strength of the flexible inorganic material layer 110F is, for example, 500 MPa to 1200 MPa, and the Young's modulus of the flexible inorganic material layer 110F is, for example, 50 GPa to 400 GPa.

Figure 9:
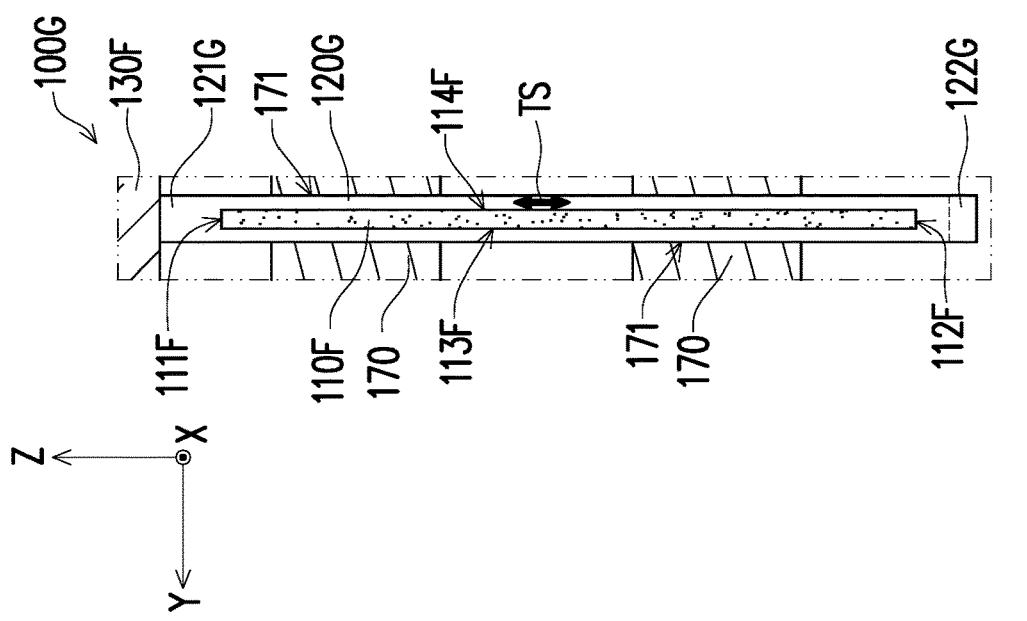
FIG. 9 is a schematic enlarged cross-sectional side view of a portion of a probe card according to another embodiment of the disclosure.

FIG. 9 is a schematic enlarged cross-sectional side view of a portion of a probe card according to another embodiment of the disclosure. Referring to FIG. 8B and FIG. 9 together, a probe card 100G of the embodiment is similar to the probe card 100F of FIG. 8B, but note a metal micro structure 120G of FIG. 9.

Referring to FIG. 9, in the embodiment, the probe card 100G includes the flexible inorganic material layer 110F, the metal micro structure 120G, and the circuit board 130F. Here, a probe of the probe card 100G is formed by the flexible inorganic material layer 110F and the metal micro structure 120G and is adapted to transmit the test signal TS.

Specifically, in the embodiment, the metal micro structure 120G is disposed on and covers the upper surface 111F, the lower surface 112F, the first side surface 113F, and the second side surface 114F of the flexible inorganic material layer 110F, and the metal micro structure 120G has a connection end 121G. The circuit board 130F is connected to the connection end 121G along the direction parallel to the Z-axis, and the test signal TS is adapted to be conducted to the circuit board 130F through the metal micro structure 120G.

In the embodiment, the probe card 100G further includes the multiple guide plates 170, and the metal micro structure 120G includes a protruding portion 122G. The design of the guide plates 170 and the protruding portion 122G is similar to the embodiment of FIG. 8B, and relevant details are not repeated here.

In the embodiment, since the metal micro structure 120G is disposed on and covers the upper surface 111F, the lower surface 112F, the first side surface 113F, and the second side surface 114F of the flexible inorganic material layer 110F, the metal micro structure 120G may be supported by the flexible inorganic material layer 110F, and thus the probe of the probe card 100G may exhibit a favorable strength and flexibility and not be likely to deform.

Figure 10:
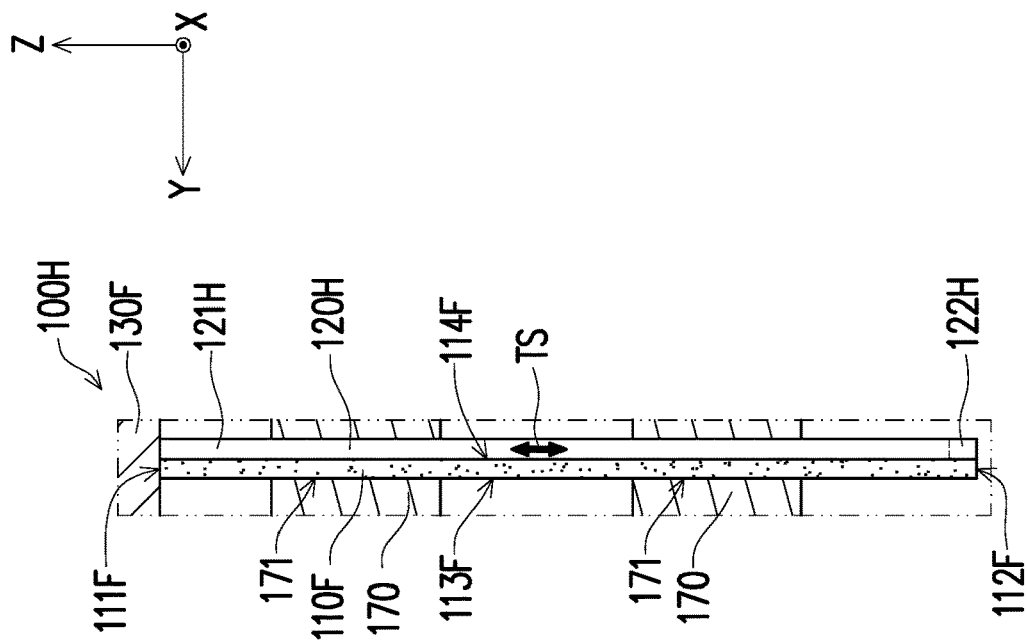
FIG. 10 is a schematic enlarged cross-sectional side view of a portion of a probe card according to another embodiment of the disclosure.

FIG. 10 is a schematic enlarged cross-sectional side view of a portion of a probe card according to another embodiment of the disclosure. Referring to FIG. 8B and FIG. 10 together, a probe card 100H of the embodiment is similar to the probe card 100F of FIG. 8B, but note a metal micro structure 120H.

Referring to FIG. 10, in the embodiment, the probe card 100H includes the flexible inorganic material layer 110F, the metal micro structure 120H, and the circuit board 130F. Here, a probe of the probe card 100H is formed by the flexible inorganic material layer 110F and the metal micro structure 120H and is adapted to transmit the test signal TS.

Specifically, in the embodiment, the metal micro structure 120H is disposed on the second side surface 114F of the flexible inorganic material layer 110F, and the metal micro structure 120H has a connection end 121H. The circuit board 130F is connected to the connection end 121H along the direction parallel to the Z-axis, and the test signal TS is adapted to be conducted to the circuit board 130F through the metal micro structure 120H.

In the embodiment, the probe card 100H further includes the multiple guide plates 170, and the metal micro structure 120H includes a protruding portion 122H. The design of the guide plates 170 and the protruding portion 122H is similar to the embodiment of FIG. 8B, and relevant details are not repeated here.

In the embodiment, since the metal micro structure 120H is disposed on the second side surface 114F of the flexible inorganic material layer 110F, the metal micro structure 120H may be supported by the flexible inorganic material layer 110F, and thus the probe of the probe card 100H may exhibit a favorable strength and flexibility and not be likely to deform.

In summary of the above, in the design of the probe card of the disclosure, since the metal micro structure is disposed on the flexible inorganic material layer and the test signal may be conducted to the circuit board along the metal micro structure, the metal micro structure may be supported by the flexible inorganic material layer when testing the device under test, and thus the probe of the probe card exhibits the favorable strength and flexibility and not be likely to deform. Accordingly, when a probe pitch and width are reduced, compared with a probe in the conventional technology that is manufactured with metal and tends to fail due to permanent deformation under force, the probe of the probe card of the disclosure is provided with the flexible inorganic material layer, thereby still exhibiting the favorable strength and flexibility. Hence, the service life and test reliability of the probe card may be increased.

Although the disclosure has been described with reference to the above embodiments, they are not intended to limit the disclosure. It will be apparent to one of ordinary skill in the art that modifications to the described embodiments may be made without departing from the spirit and the scope of the disclosure. Accordingly, the scope of the disclosure will be defined by the attached claims and their equivalents and not by the above detailed descriptions.

What is claimed is:

1. A probe card, comprising:
   a flexible inorganic material layer having a first surface and a second surface opposite to each other;
   a metal micro structure disposed on the first surface; and
   a circuit board disposed on the second surface, wherein the circuit board is electrically connected to the metal micro structure, and a test signal is adapted to be conducted to the circuit board through the metal micro structure;
   wherein a yield strength of the flexible inorganic material layer is greater than 500 MPa, or a Young's modulus of the flexible inorganic material layer is greater than 50 GPa,
   wherein the metal micro structure comprises a protruding portion, and the protruding portion is disposed at an end corresponding to the flexible inorganic material layer, and
   wherein the protruding portion directly contacts the metal micro structure.

2. The probe card according to claim 1, wherein the flexible inorganic material layer comprises a body portion and a plurality of interdigitated portions, the metal micro structure comprises a plurality of metal sub-structures, the metal sub-structures correspond to and are connected to the interdigitated portions, the interdigitated portions are connected to one side of the body portion, and each of the metal sub-structures is adapted to extend with a corresponding interdigitated portion toward the body portion along a direction.

3. The probe card according to claim 2, further comprising:
   a via located at the body portion of the flexible inorganic material layer and penetrating the first surface and the second surface, wherein the via is connected to each of the metal sub-structures and the circuit board, each of the metal sub-structures is disposed on the first surface and the via, and the test signal is conducted to the circuit board through the metal micro structure along the via.

4. The probe card according to claim 2, wherein the metal micro structure comprises a plurality of protruding portions, and each of the protruding portions is disposed at a corresponding metal sub-structure and located on a third surface opposite to the first surface.

5. The probe card according to claim 1, further comprising:
   a first conducting wire layer disposed on the second surface of the flexible inorganic material layer and a first side wall of the flexible inorganic material layer close to the circuit board, and the first conducting wire layer is connected to the metal micro structure and the circuit board,
   wherein the test signal is conducted to the circuit board through the metal micro structure and the first conducting wire layer.

6. The probe card according to claim 1, further comprising:
   a second conducting wire layer disposed on the second surface of the flexible inorganic material layer and a second side wall of the flexible inorganic material layer away from the circuit board, and the second conducting wire layer is connected to the metal micro structure and the circuit board,
   wherein the test signal is conducted to the circuit board through the metal micro structure and the second conducting wire layer.

7. The probe card according to claim 1, wherein a material of the flexible inorganic material layer comprises glass, ceramic, or a silicon wafer.

8. The probe card according to claim 1, wherein a material of the protruding portion comprises an alloy of nickel, cobalt, and phosphorus, an alloy of nickel and cobalt, an alloy of nickel and manganese, or an alloy of rhodium and ruthenium.

9. The probe card according to claim 1, wherein the circuit board has a horizontal face and an inclined face opposite to each other, the second surface of the flexible inorganic material layer is connected to the inclined face of the circuit board, the flexible inorganic material layer has a first end and an opposite second end opposite to the second surface, and a difference between a vertical distance from the first end to the horizontal face and a vertical distance from the second end to the horizontal face ranges from 50 μm to 500 μm.

10. The probe card according to claim 9, wherein an inclination of the inclined face relative to the horizontal face is 1.5 degrees to 6 degrees.

11. The probe card according to claim 1, further comprising a bonding layer located between the flexible inorganic material layer and the circuit board, wherein a material of the bonding layer comprises Ajinomoto Build-up Film (ABF), tin, a tin alloy, or silver paste.

12. The probe card according to claim 1, wherein a ratio of a length of the flexible inorganic material layer to a thickness of the flexible inorganic material layer ranges from 9 to 30.

13. The probe card according to claim 1, wherein a thickness of the flexible inorganic material layer ranges from 30 μm to 300 μm.

14. A probe card, comprising:
a flexible inorganic material layer having a plurality of surfaces;
a metal micro structure disposed on at least one of the plurality of surfaces and having a connection end;
a circuit board connected to the connection end, wherein a test signal is adapted to be conducted to the circuit board through the metal micro structure; and
at least two guide plates, wherein each of the at least two guide plates has a plurality of through-holes, and the flexible inorganic material layer and the metal micro structure penetrate the plurality of through-holes of each of the at least two guide plates;
wherein a yield strength of the flexible inorganic material layer is greater than 500 MPa, or a Young's modulus of the flexible inorganic material layer is greater than 50 GPa,
wherein the metal micro structure comprises a protruding portion and the protruding portion is located at an end opposite to the connection end, and
wherein the protruding portion directly contacts the metal micro structure.

15. The probe card according to claim 14, wherein the material of the flexible inorganic material layer comprises glass, ceramic, or a silicon wafer.

16. The probe card according to claim 14, wherein a material of the protruding portion comprises an alloy of nickel, cobalt, and phosphorus, an alloy of nickel and cobalt, an alloy of nickel and manganese, or an alloy of rhodium and ruthenium.

17. The probe card according to claim 14, wherein the plurality of surfaces of the flexible inorganic material layer comprise an upper surface and a lower surface opposite to each other and a first side surface and a second side surface connected to the upper surface and the lower surface, and the metal micro structure is disposed on and covers the upper surface, the lower surface, and the second side surface.

18. The probe card according to claim 14, wherein the plurality of surfaces of the flexible inorganic material layer comprise an upper surface and a lower surface opposite to each other and a first side surface and a second side surface connected to the upper surface and the lower surface, and the metal micro structure is disposed on and covers the upper surface, the lower surface, the first side surface, and the second side surface.

* * * * *